United States Patent [19]

Fleming

[11] 3,846,717

[45] Nov. 5, 1974

[54] BULK EFFECT SEMICONDUCTOR OSCILLATOR INCLUDING RESONANT LOW FREQUENCY INPUT CIRCUIT

[75] Inventor: Paul L. Fleming, Peekskill, N.Y.

[73] Assignee: International Business Machines Corporation, Armonk, N.Y.

[22] Filed: Feb. 2, 1966

[21] Appl. No.: 524,594

[52] U.S. Cl. .................... 332/52, 307/274, 307/286, 331/107 G

[51] Int. Cl. .......................... H03b 7/06, H03c 1/14

[58] Field of Search .................... 307/287, 286, 274; 317/234; 332/31 T, 52, 52 T; 331/107 G

[56] References Cited

UNITED STATES PATENTS

| | | | |
|---|---|---|---|
| 3,089,967 | 5/1963 | Strull | 307/286 X |
| 3,134,949 | 5/1964 | Tiemann | 307/322 X |
| 3,339,153 | 8/1967 | Hakki | 331/107 G |
| 3,365,583 | 1/1968 | Gunn | 331/107 G X |
| 3,422,289 | 1/1969 | Atalla et al. | 307/299 |

OTHER PUBLICATIONS

Kuru – "Frequency Modulation of the Gunn Oscillator" Proc. of the IEEE, Vol. 53, No. 10 Oct. 1965 pp. 1642,1643.

*Primary Examiner*—Alfred L. Brody
*Attorney, Agent, or Firm*—Bernard N. Wiener; John E. Dougherty, Jr.

[57] ABSTRACT

The high frequency oscillator includes a body of n-type gallium arsenide which exhibits a bulk negative resistance when the field applied to the body exceeds a threshold field. The input circuit for theoscillator forms, with the gallium arsenide body, a circuit which is resonant at a frequency lower than the frequency of the output. An input signal is applied which causes the threshold field to be exceeded and high frequency output oscillations to be produced in the output circuit. The negative resistance then exhibited by the body causes the input voltage in the low frequency resonant circuit to oscillate reaching amplitudes in excess of the applied voltage and causing a high power output to be realized at the higher frequency.

7 Claims, 17 Drawing Figures

INVENTOR
PAUL L. FLEMING

BY Bernard N. Wiener
ATTORNEY

FIG. 3A
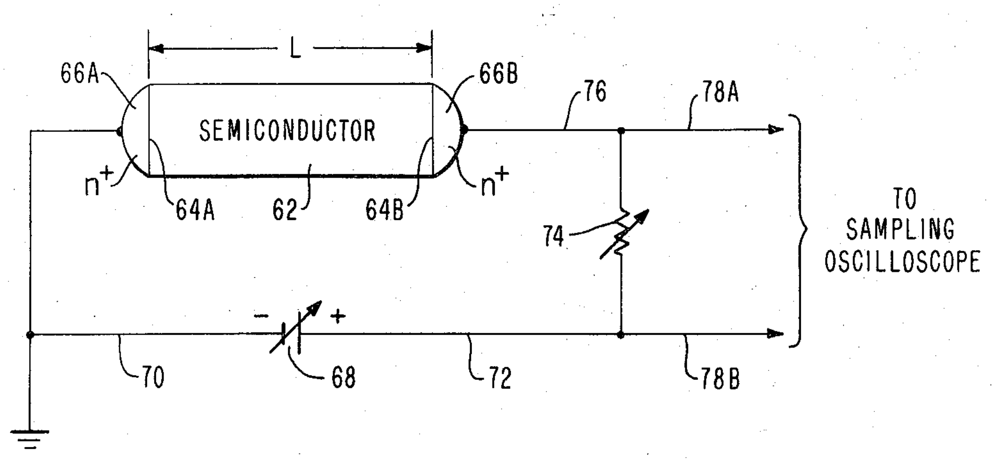
FIG. 3B
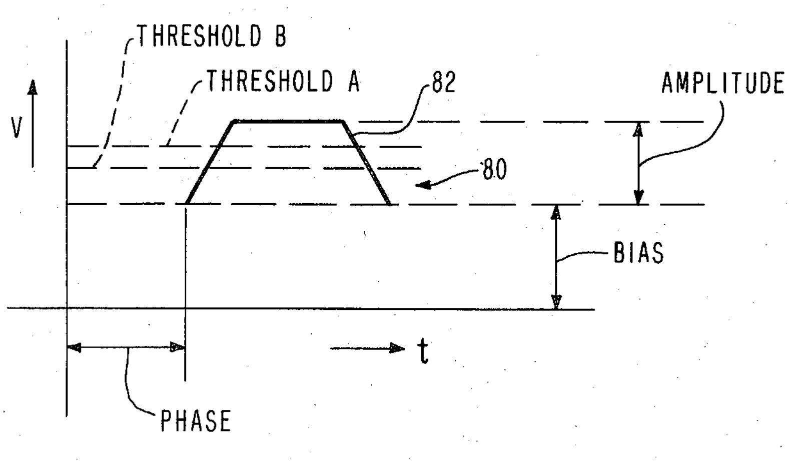
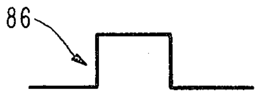
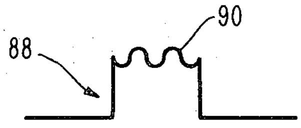
FIG. 3C FIG. 3D

VOLTAGE AT DRIVE TERMINAL

CURRENT AT DRIVE TERMINAL

RF OUTPUT ON SAMPLING SCOPE

CENTER PORTION OF A BURST 98

BULK EFFECT SEMICONDUCTOR OSCILLATOR INCLUDING RESONANT LOW FREQUENCY INPUT CIRCUIT

This invention relates generally to modulated electrical shock wave oscillators and it relates more particularly to drive circuitry therefor.

An electrical shock wave microwave oscillator utilizes an electrical shock wave device coupled to a microwave transmission line or to a microwave cavity. The electrical shock wave device is a monocrystalline compound semiconductor, e.g., n-type GaAs or InP. If an electric field having a magnitude above a particular threshold is applied across the crystalline region of an electrical shock wave device, a current fluctuation is produced in a load circuit coupled thereto. The current fluctuation has been determined theoretically to originate from hot electrons which group in the semiconductor crystal under influence of the electric field and give rise transiently to an electrical shock wave, termed the Gunn Effect, that propagages between the terminals of the crystalline region. The initiation of an electrical shock wave in an electrical shock wave device is sometimes referred to as the nucleation of a domain therein.

Theoretical considerations indicate that the Gunn Effect arises from a transfer of conduction electrons in a semiconductor from a central energy minimum to adjacent energy maximum where they have lower mobility.

An electrical shock wave device includes a circuit wherein electrical shock wave propagation occurs in a semiconductor region. During activation of an electrical shock wave device there is a non-uniform field distribution in a semiconductor region which moves in space as time proceeds. It is this movement of a high field region which traverses the semiconductor region from cathode to anode and is reinitiated at the cathode that provides repetitious electrical shock wave propagation. There occurs a change in the current in the circuit of the electrical shock wave device related to the electrical shock wave propagation in the semiconductor region.

The electrical shock wave propagation is a transient localized space charge distribution that traverses the region in the presence of a sufficiently intense electric field gradient. In order for the localized space charge distribution to occur in the semiconductor region, it is required that there be present a sufficient density of conduction electrons and an inhomogeneity in the electric field gradient. The normal density, i.e., the equilibrium density of conduction electrons in a semiconductor region of an electrical shock wave device, is descriptive of the n-type charge carriers available for current at a particular temperature due to the crystalline structure and dopant concentration of the semiconductor region.

The original electrical shock wave device, now termed the Gunn Effect device, is presented in U.S. Pat. No. 3,365,583 issued Jan. 23, 1968, from an application filed June 12, 1964 by J. B. Gunn, and assigned to the assignee hereof. It is a continuation-in-part of U.S. Pat. application Ser. No. 286,700, filed June 10, 1963, and now abandoned. Illustrative background articles which describe prior art electrical shock wave devices are: "Instabilities of Current in III-V Semiconductors," by J. B. Gunn, IBM Journal of Research and Development, April 1964, pages 141 to 159; "The Gunn Effect", by J. B. Gunn, Journal of International Science and Technology, October 1965, pages 43 to 56; "Continuous Microwave Oscillations of Current in GaAs", by N. Braslau, et al., IBM Journal of Research and Development, November 1964, pages 545 and 546; and "Synchronized Non-Reciprocal GaAs Oscillator Circuit", by P. L. Fleming, IBM Technical Disclosure Bulletin, August 1965, page 415.

It has been demonstrated in the practice of the prior art that electrical shock wave propagation can be supported in a semiconductor region of either GaAs or InP. These materials are presumed to be exemplary of many semiconductor regions within which electrical shock wave propagation can be established. It has been determined that a resistivity less than approximately 100 ohm-centimeter in the semiconductor region is required for there to be present a normal density of conduction electrons sufficient to permit electrical shock wave propagation in the region.

An energized electrical shock wave device provides output current pulses whose initiation and character are accurately related to the nature and duration of the input voltage pulse, i.e., the sequence of electrical shock waves generated in the semiconductor region, is accurately dependent on the starting time and shape of the triggering or driving pulse. Thus, for an input pulse which is repeated identically in a train of voltage pulses, the output current wave from the electrical shock wave microwave oscillacor is repeated identically in both shape and phase relative to each identical member of the input train of voltage pulses.

In the operation of the prior art electrical shock wave device, as described in the noted copending patent application and articles, the output current oscillation is a series of individual oscillatory pulses. If the triggering pulse is so long in duration as effectively to be direct voltage, the microwave oscillation is continuous wave.

It is desirable for certain applications to be able to modulate an electrical shock wave device. Illustratively, it may be desirable to operate an electrical shock wave device over extremely short intervals to minimize power dissipation as heat. For other applications it is desirable to modulate the high frequency oscillation as it is delivered to the output of an electrical shock wave oscillator. Further, it is desirable that an electrical shock wave oscillator be operated at as high an operational power transformation efficiency as possible. Heretofore, these desirable advantages obtained by modulating an electrical shock wave oscillator have not been achievable with sufficient control and efficiency. In particular, it is desirable that self-modulation and improved efficiency be obtained simultaneously.

It is an object of this invention to provide modulation of the oscillation from an electrical shock wave device.

It is another object of this invention to provide an electrical shock wave oscillator which is self-modulated.

It is another object of this invention to provide an electrical shock wave oscillator which is self-moldulated and has effective decoupling between the relatively high frequency oscillation produced by the electrical shock wave device and the relatively low frequency modulating oscillation.

It is another object of this invention to provide an electrical shock wave oscillator which has an especially high efficiency of power transformation from the driving power to the output power.

This invention provides a modulated electrical shock wave oscillator. In an aspect of the invention, self-modulation of the electrical shock wave oscillation from an electrical shock wave device is achieved by coupling a resonant circuit to the electrical shock wave device in the driving circuit at an unstabilized driving terminal. The high frequency oscillation in the output of the oscillator is effectively decoupled from the low frequency driving circuit.

In another aspect of the invention, the relatively high frequency output oscillation from an electrical shock wave device is modulated by driving the electrical shock wave device with a relatively low frequency oscillation at a stabilized driving terminal obtained from an external oscillator.

The practice of this invention is especially adapted to providing a tuned intermediate frequency radar system which does not require a local oscillator at the receiver.

The foregoing and other objects, features and advantages of the invention will be apparent from the following more particular description of preferred embodiments of the invention as illustrated in the accompanying drawings.

FIGS. 3A, 3B, 3C, and 3D present several diagrams descriptive of aspects of prior art useful for comparison with the practice of this invention in which:

FIG. 3A is a schematic circuit diagram used for explaining the general nature of the prior art.

FIG. 3B is a line diagram characterizing several pertinent parameters of an input voltage pulse applied across the semiconductor region of FIG. 3A for establishing a requisite electric field gradient therein.

FIGS. 3C and 3D are line diagrams illustrative of current waveforms prior to and after the onset of electrical shock wave propagation in the semiconductor region of FIG. 3A.

Figure 4A:
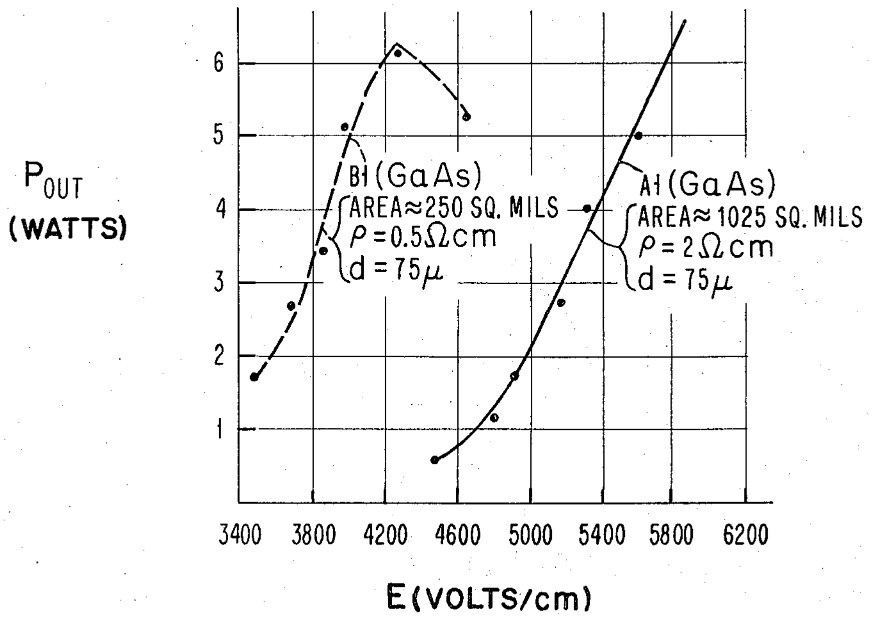
Figure 4B:
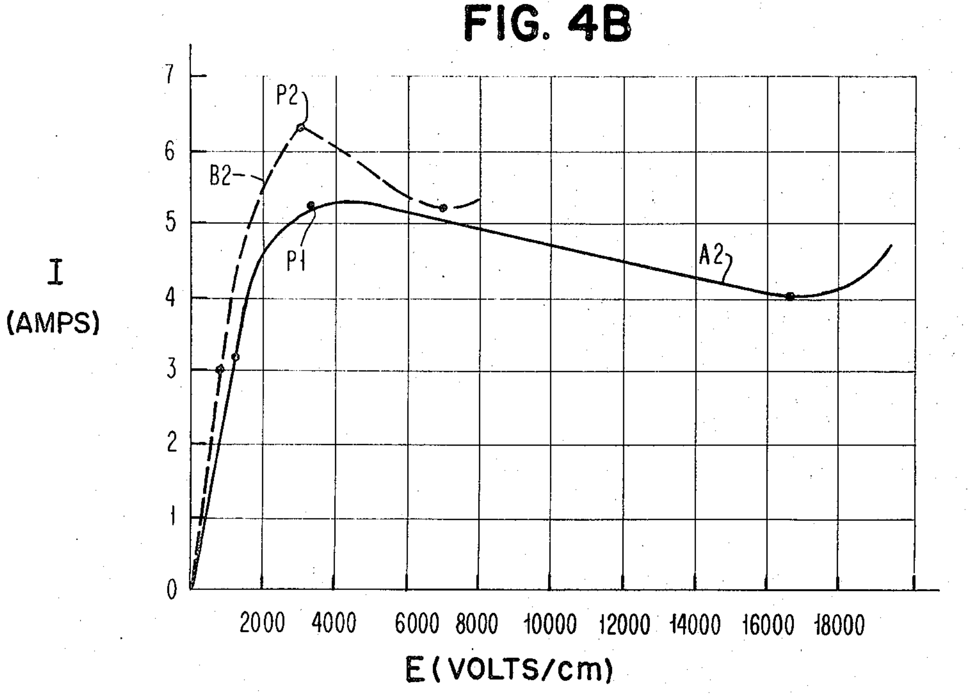

FIGS. 4A and 4B present characteristic curves for electrical shock wave devices used in the practice of this invention showing plots of high frequency output power versus applied electric field and of current versus applied electric field, respectively.

Figures 1, 2A:
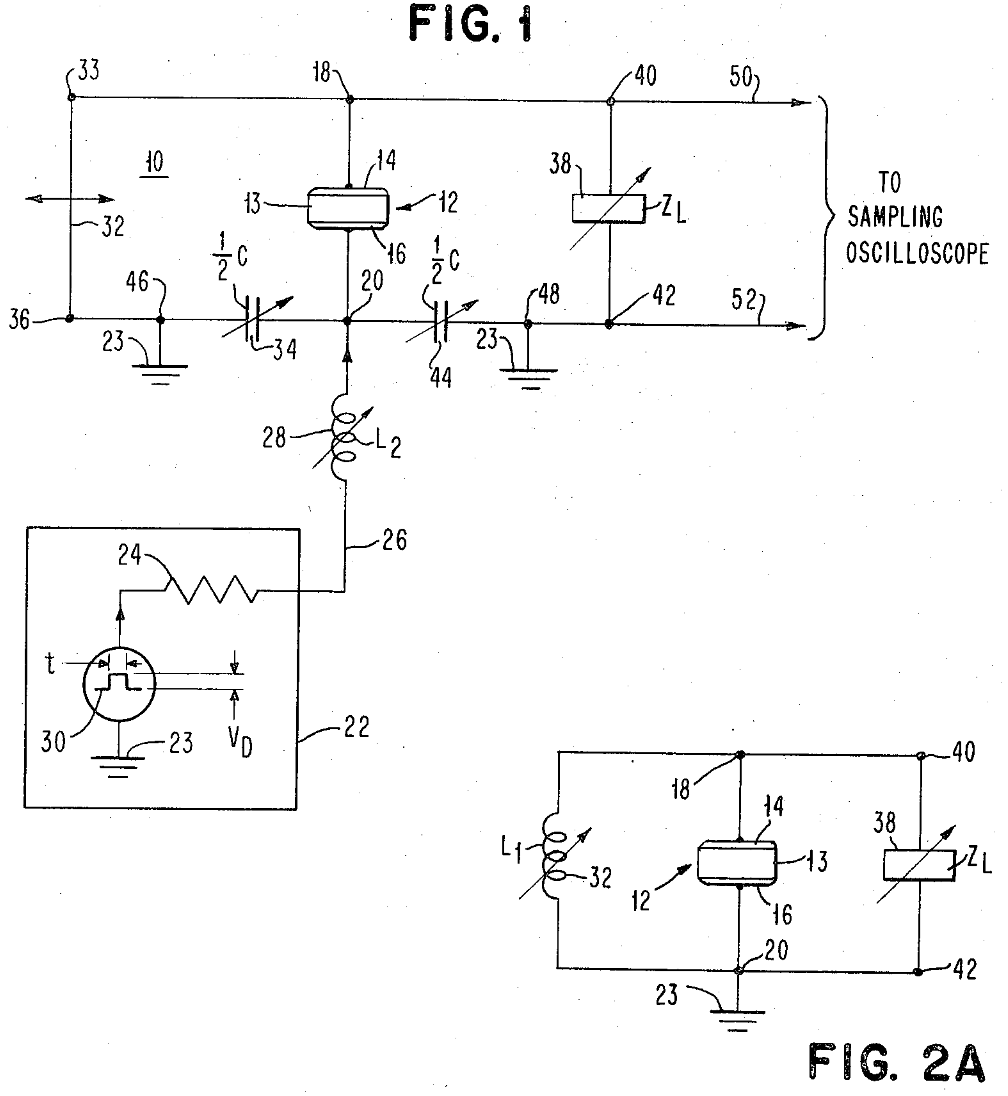
FIG. 1 is a schematic circuit diagram illustrating an unstabilized drive circuit for an electrical shock wave oscillator in accordance with the practice of this invention which utilizes transmission line circuitry in the output and distributed or lumped circuit elements in the drive circuit.
FIGS. 2A and 2B are equivalent circuit diagrams for the electrical shock wave oscillator of FIG. 1 showing respectively the equivalent circuit diagrams for the electrical shock wave device at the high frequency oscillation and at the low frequency oscillation in the drive circuit.
Figure 5A:
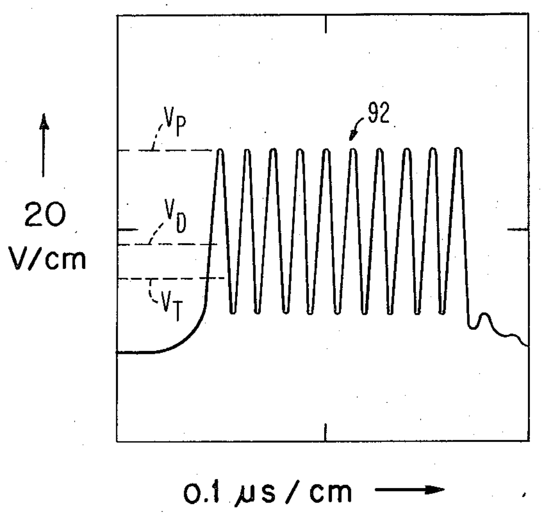
Figure 5B:
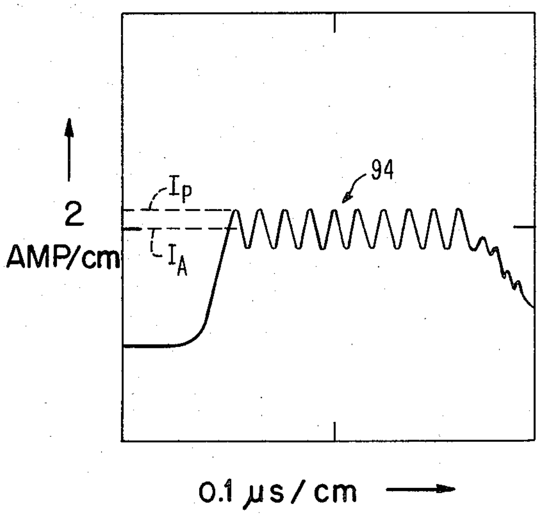

FIG. 5A is an idealized illustration of an oscilloscope presentation of the low frequency voltage oscillation at the drive terminal of the electrical shock wave oscillator of FIG. 1 superimposed on a drive voltage; and FIG. 5B is an idealized illustration of the current waveform at the drive terminal of the electrical shock wave oscillator of FIG. 1.

Figure 6A:
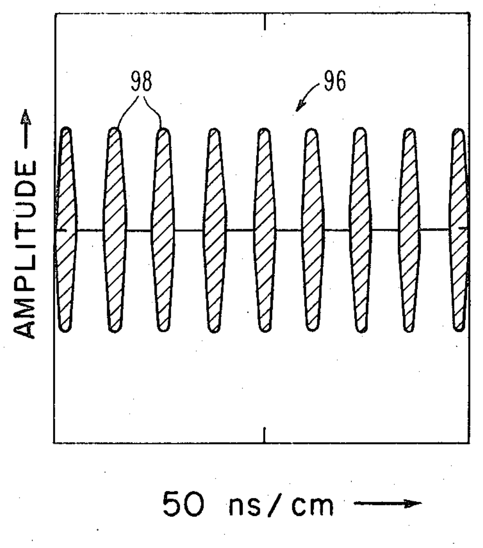
Figure 6B:
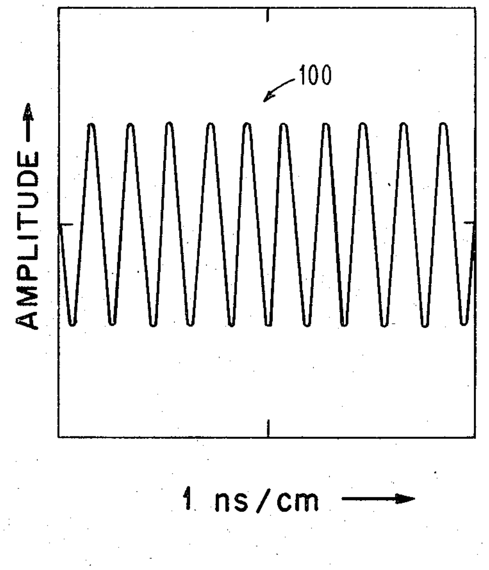

FIG. 6A is an idealized illustration of a sampling oscilloscope display of the high frequency output oscillation from the electrical shock wave oscillator of FIG. 1; and FIG. 6B is an expanded presentation of the central portion of a single high frequency oscillation burst in FIG. 6A.

Figure 7:
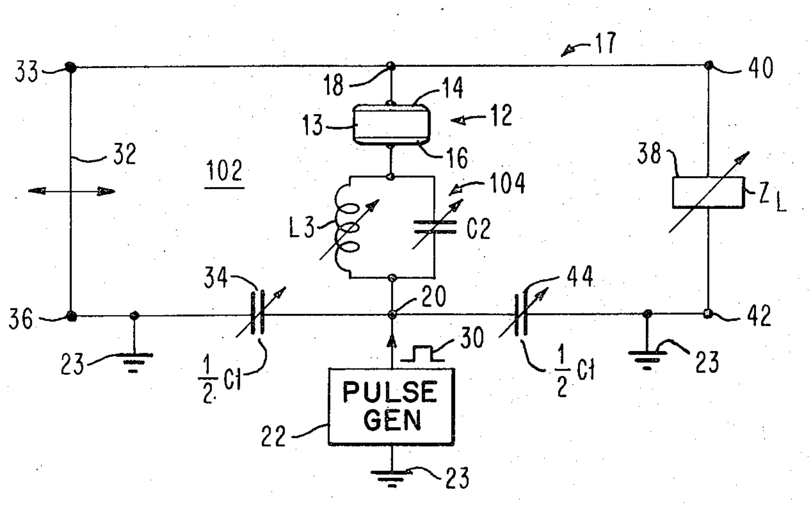

FIG. 7 illustrates a schematic circuit diagram of an embodiment of the invention wherein a resonant circuit used for self-modulation of an electrical shock wave oscillator is incorporated within the high frequency transmission line but effectively decoupled therefrom.

Figure 8:
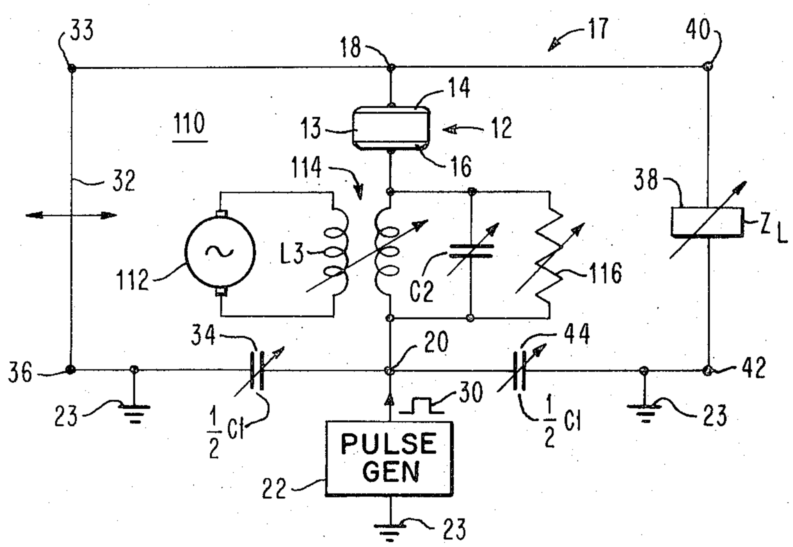

FIG. 8 presents an embodiment of this invention which modifies the embodiment of FIG. 7 by using an external source of low frequency oscillation connected to a stabilized driving terminal and established electrically within the high frequency transmission line circuit.

Figure 9:
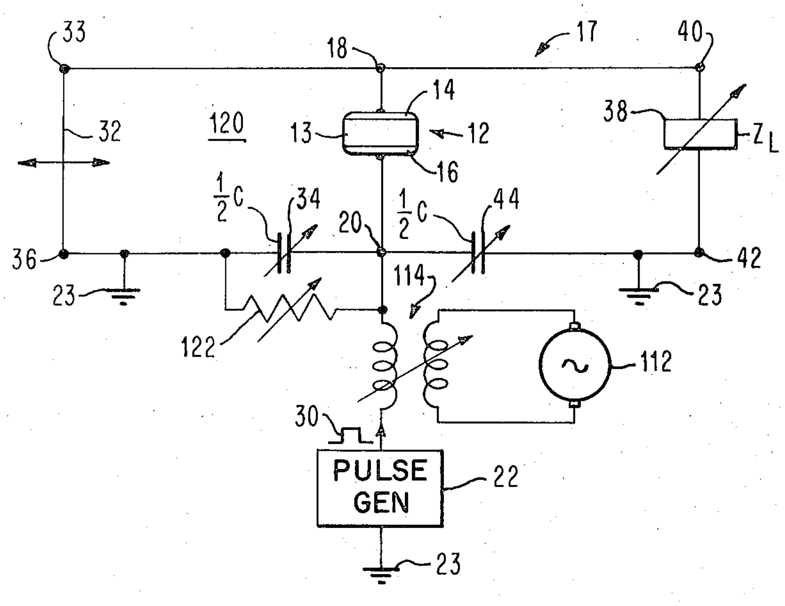

FIg. 9 presents an embodiment of this invention in which an external source of low frequency oscillation is used to modulate the high frequency modulation from an electrical shock wave device by driving it at a stabilized driving terminal.

Figure 10:
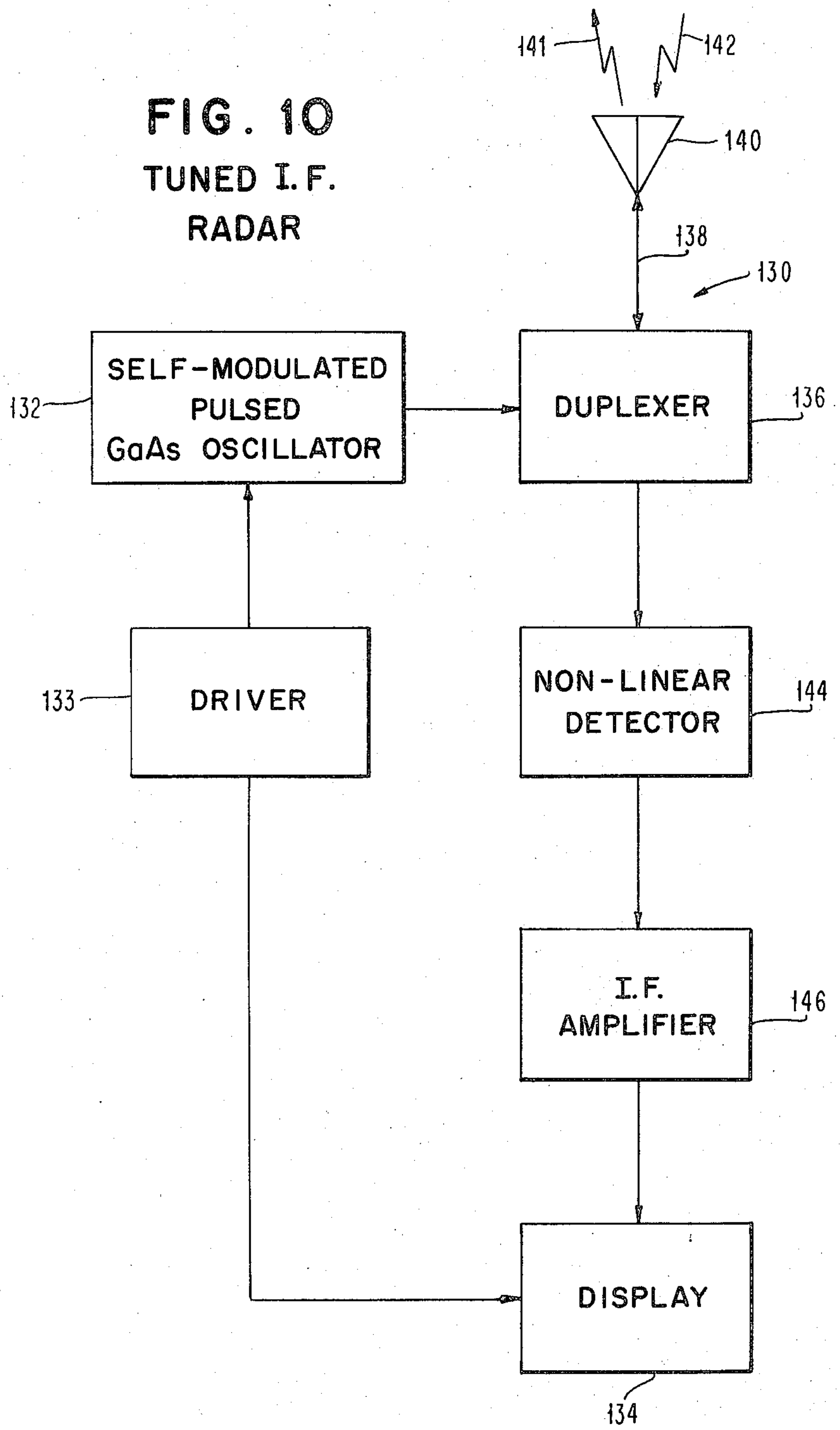

FIG. 10 is a block diagram showing use of an electrical shock wave oscillator in accordance with the practice of this invention as a radio frequency source for a tuned intermediate frequency radar system.

With reference to the drawings in greater detail, a preferred embodiment 10 of this invention will be described with reference to FIG. 1 which presents a schematic circuit diagram illustrating the connection of an electrical shock wave device in a microwave transmission line 17 with an unstabilized drive terminal 20. An electrical shock wave device 12 has semiconductor region 13 with ohmic contacts 14 and 16 thereon. It is connected to transmission line 17 at points 18 and 20. Connection point 20 is the drive terminal at which is applied a voltage level for initiating electrical shock wave propagation in electrical shock wave device 12. A pulse generator 22 having an internal resistance 24 is connected via connection line 26 to drive terminal 20. Pulse generator 22 may conveniently utilize a conventional emitter-follower transistor circuit driven by a conventional pulse source. Connection line 26 is represented as having a distributed inductance 28. For the operational illustrative embodiment 10 of FIG. 1 as described hereinafter, pulse generator 22 grounded at point 23 provides a rectangular pulse 30 with a time duration t and a voltage level $V_D$. However, as will be described, pulse generator 22 may provide a continuous voltage level for another exemplary operation of the embodiment 10. Connection point 18, to which contact 14 of electrical shock wave 12 is affixed, is connected by transmission line 17 to movable microwave-frequency short 32 at connection point 33. The other end of electrical shock wave device is connected via drive terminal 20 and coupling capacitance 34 to the other end of 36 microwave-frequency short 32. The remaining circuit connections presented in FIG. 1 for embodiment 10 of this invention include impedance load 38 connected to transmission line 17 at connection points 40 and 42. Impedance load 38 may be either resistive or complex. Movable microwave-frequency short 32 is positioned in transmission line 17 in tuned relationship with impedance load 38.

Drive terminal 20 of electrical shock wave device 12 is connected via capacitance 44 and transmission line 17 to connection point 42. Additionally, transmission line 17 is connected to ground 23 at connection points 46 and 48 between capacitance 34 and microwave-frequency short 32 and between capacitance 44 and impedance load 38. A measure of the voltage drop across impedance load 38 is presented to a sampling oscilloscope, not shown, via connection lines 50 and 52 connected to impedance load 38 at connection points 40 and 42, respectively. In operation, when voltage pulse 30 from pulse generator 22 initiates self-modulated microwave-frequency waveform output from electrical shock wave device 12 at terminals 18 and 20 thereof, the unstabilized drive terminal 20 is effectively a decoupling point between the relatively low frequency driving voltage (FIG. 5A) for electrical shock wave device 12 and the produced relatively high frequency output voltage (FIG. 6B) therefrom.

The construction of an exemplary physical structure not shown for implementing the embodiment 10 of FIG. 1 will now be described.

With reference to the circuit diagram in FIG. 1, electrical shock wave device 12 is mounted in a symmetrical strip transmission line 17. The strip transmission mount includes a movable short 32, radio frequency by-pass capacitors 34 and 44, ground terminal 46 and 48, drive terminal 20, and connection point 40 from strip transmission line to a coaxial line, not shown. The variable complex load 38 is implemented by a coaxial double stub tuner, not shown, connected to the latter coaxial line. The stub tuner is terminated on one end in its characteristic impedance, not shown. Pulse driving source 22 comprises an emitterfollower circuit, not shown, driven by a conventional pulse generator, not shown. Inductance 28 is either lumped or distributed in the interconnection 26 between the pulse generator 22 and the drive terminal 20.

Figure 2B:
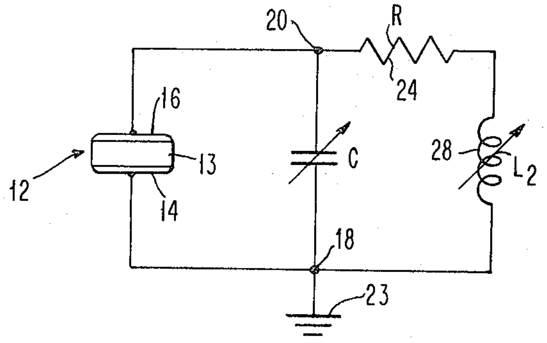

Equivalent circuits are presented in FIGS. 2A and 2B for the embodiment 10 of FIG. 1 illustrating the decoupled circuits, respectively, for the high frequency oscillation in transmission line 17 and the low frequency oscillation at drive terminal 20.

In FIG. 2A, the inductance L1 is the effective inductance of microwave-frequency short 32 in transmission line 17. Coupling capacitances 34 and 44 are omitted from FIG. 2A as they are effective short circuits to ground 23 for the high frequency oscillation from electrical shock wave device 12.

In FIG. 2B, capacitance C which is the combined capacitance value for capacitances 34 and 44 is connected across electrical shock wave device 12, and in parallel therewith is a circuit path comprising an inductance L2 and a resistance R, which represent the combined distributed inductance and resistance for pulse generator 22 and connection line 26. Through consideration of equivalent circuits FIGS. 2A and 2B, it is apparent that any low frequency voltage developed across electrical shock wave device 12 does not appear across impedance load 38; and that any high frequency voltage across electrical shock wave device is not presented to pulse generator 22.

Before presenting the nature and character of the waveforms produced in the embodiment 10 of FIG. 1, there will first be presented a discussion of relevant prior art with reference to FIG. 3 so that it will be available for comparison purpose.

With reference to FIG. 3A, a prior art electrical shock wave device has a semiconductor crystalline region 62, preferably monocrystalline GaAs or InP, having an active length L between faces 64A and 64B. Ohmic $n^+$ contacts 66A and 66B are established on semiconductor faces 64A and 64B, respectively. Electrical connections are made to the ohmic $h^+$ contacts in circuit relationship to variable voltage source 68. Voltage source 68 has its negative terminal connected via conductor 70 to contact 66A; and it has its positive terminal connected via a path consisting of conductor 72, load resistor 74, and conductor 76 to contact 66B. A measure of the current in load resistor 74 is obtained via conductors 78A and 78B connected, respectively, to conductors 76 and 72 for presentation of a replica of the voltage drop therein on the display tube face of a sampling oscilloscope, not shown.

The semiconductor region 62 may be monocrystalline GaAs or InP with an n-type doping concentration, i.e., normal equilibrium density of conduction electrons, sufficient to permit electrical shock wave propagation therein. An electrical shock wave is a localized space charge distribution in semiconductor region 62 which is initiated contiguous to contact 66A and propagates across the length L of region 62 to contact 66B. It arises concomitantly with a local inhomogeneity in an electric field established between contacts 66A and 66B by voltage source 68 provided the electric field is initially at least to a certain threshold level A shown in FIG. 3B.

The electrical shock wave initiated at cathode 66A continues to propagate across the semiconductor region 62 provided that the electrical field is maintained at least to the level obtained by the application of a voltage threshold level B. In FIG. 3B an additional bias level is indicated representative of a constant voltage applied across semiconductor region 62 to which the voltage level 82 of pulse 80 is added. Except for power dissipation limitations, the voltage level 82 may be continuously applied across the semiconductor region 62.

FIGS. 3C and 3D are idealized current waveforms useful for explaining the relationship between current in semiconductor region 62 and the voltage applied between contacts 66A and 66B. Under the assumption that voltage pulse 80 has an upper voltage level 82 less than threshold level A, the current in load 74 as presented on the display tube face of a sampling oscilloscope, not shown, is that of FIG. 3C. It is noted that the current waveform 86 of FIG. 3C is comparable in shape to voltage pulse 80 of FIG. 3B. When the upper level 82 of voltage pulse 80 exceeds that of threshold level A, a localized space charge distribution is initiated near contact 66A and propagates toward contact 66B. The concomitant change in current is repeated for each electrical shock wave launched from contact 66A. There is illustrated in FIG. 3D an exemplary current waveform 88 having a high frequency oscillation 90 which exists during the time interval that a voltage pulse 80 whose upper level 82 is maintained above threshold level B is applied across semiconductor region 62.

FIGS. 4A and 4B present performance curves for an electrical shock wave oscillator according to the embodiment 10 of FIG. 1 obtained by stabilizing the terminal 20 of FIG. 1 with a resistance connection, not shown, to ground during measurement. In FIG. 4A the performance curves are plotted with the microwave-frequency output power in watts on the ordinate axis and the applied electric field gradient in the semiconductor region 13 between contacts 14 and 16 in volts per centimeter. Curve A1 produced with a heavy line is characterized by a steadily increasing value with increasing field; whereas curve B1, shown as a dashed line, has a peak value. Materials of GaAs having the properties of both curve A1 and curve B1 are suitable for the practice of this invention. However, a material having a high frequency power output versus applied field gradient according to the characteristic of curve A1 is especially suitable for the practice of this invention, as the steadily increasing power transformation efficiency indicated thereby permits operation of the embodiment 10 with especially desirable ultimate power transformation efficiency. Exemplary power transformation efficiency achieved is 13 percent for a monocrystalline region 13 of GaAs having a cross-sectional area of approximately $10^3$ square mils, resistivity of 2 ohm cm, and thickness between contacts 14 and 16 of 75 microns.

Monocrystalline GaAs for operation as characterized by curve A1 is presented in U.S. Pat. No. 3,322,501 issued May 30, 1967, and Pat. No. 3,551,116, which issued Dec. 29, 1970 from application Ser. No. 740,778 field June 4, 1968, which was a continuation of application Ser. No. 468,898, for "A Process for Preparing Low Resistivity High Purity Gallium Arsenide," By J. M. Woodall et al, filed July 1, 1965.

Broadly, in the practice of the noted U.S. Pat. No. 3,322,501 gallic oxide ($Ga_2O_3$) is made to react with carbon to produce an atmosphere of gallous oxide and a non-contaminating compound of carbon at a given pressure to suppress the formation of free silicon, which acts as a contaminant in gallium arsenide. In the practice of the noted copending patent application Ser. No. 468,898, high purity, low resistivity GaAs is produced by a method including heat treating GaAs crystals having predetermined carrier concentrations for times and temperatures insufficient to permit donor diffusion from the bulk of the samples but sufficient to permit acceptor removal from the lattice of the crystals such that the carrier concentrations therein are changed from the predetermined carrier concentrations.

The curves A2 and B2 of FIG. 4B are derived from the data of curves A1 and B1, respectively, of FIG. 4A under an assumption of cubic symmetry in the current versus voltage characteristic; and considering the data indicated by the waveforms of FIGS. 5A, 5B and 6A. Curves A2 and B2 are plots of current in amperes on the ordinate scale and applied electric field gradient in semiconductor region 13 of FIG. 1 between contacts 14 and 16. Curve A2 is characterized by an extended portion of negative resistance in contrast with a relatively short portion of negative resistance in curve B2. The portions of curves A2 and B2 to the right of points P1 and P2, respectively, are extrapolated in accordance with the noted assumption of a cubic symmetry model.

Theoretical considerations indicate that the low frequency oscillation typical of the equivalent circuit presented in FIG. 2B is derived from the cooperation of the negative resistance of semiconductor 13 during electrical shock wave propagation therein with the resonant circuit including C, R, and L2 where C is indicative of the combined capacitances 34 and 44 of embodiment 10 of FIG. 1, R is the resistance 24 of the pulse generator 22 and connection 26, and L2 is the distributed inductance of pulse generator 22 and connection 26. Under the operational condition that semiconductor region 13 manifests a negative resistance, it serves as a power source for initiating oscillation in the equivalent circuit of FIG. 2B.

FIGS. 5 and 6 are idealized presentations of oscilloscope displays descriptive of the operation in embodiment 10 of FIG. 1. In FIGS. 5A and 5B there are presented oscilloscope displays of the voltage waveform 92 and current waveform 94, respectively, at drive terminal 20. These waveforms are obtained as displays on a conventional oscilloscope, not shown, obtained by a probe, not shown, placed near drive terminal 20. The scales in FIG. 5A are 20 volts per centimeter vertically and 0.1 microseconds per centimeter in the horizontal direction. The scales in FIG. 5B are 2 amperes per centimeter in the vertical direction and 0.1 microseconds per centimeter in the horizontal direction. Thus, in comparison with the rectangular drive voltage waveform 82 of FIG. 3B, the effective drive voltage across semiconductor region 13 between contacts 14 and 16 of FIG. 1 is oscillatory. Whereas FIG. 3D depicts the high frequency oscillation produced by the semiconductor device of FIG. 3A, FIG. 5B depicts a low frequency oscillation in the drive current itself.

Low frequency voltage waveform 92 of FIG. 5A is characterized by three voltage levels: threshold voltage level $V_T$, drive voltage level $V_D$, and peak voltage level $V_P$. The threshold voltage level $V_T$ is the lowest voltage level that initiates electrical shock wave propagation in electrical shock wave device 12. The drive voltage level $V_D$ optimizes the voltage swing of voltage waveform 92. The peak voltage level $V_P$ is the highest voltage level achieved by voltage waveform 92. The maximum power transformation efficiency of the embodiment 10 of FIG. 1 is achieved for a drive pulse 30 with a time duration *t* which is approximately one half of the reciprocal of the self-modulation frequency of voltage waveform 92.

Low frequency current waveform 94 of FIG. 5B at drive terminal 20 is characterized by two current levels: the average current level $I_A$ and the peak current level $I_P$. The peak current level $I_P$ corresponds to the drive voltage level $V_D$ of FIG. 5A. The average current level $I_A$ is the average level of the current waveform 94.

FIGS. 6A and 6B present idealized sampling oscilloscope displays of the high frequency oscillation from electrical shock wave device 12 of FIG. 1 as presented on lines 50 and 52. The trace 96 of the oscilloscope display presented in FIG. 6A is made up of a plurality of bursts 98 caused by each voltage cycle of the drive voltage 92 of FIG. 5A. Within each burst 98 is a high frequency oscillation of which the central portion within a burst 98 is presented as waveform 100 of FIG. 6B. The respective horizontal scales for FIGS. 6A and 6B are 50 nanoseconds per centimeter and 1 nanosecond per centimeter, respectively, where a nanosecond is $10^{-9}$ seconds. The vertical scale for FIGS. 6A and 6B is not presented since the measurement is made with attenuation in the coupling to the sampling oscilloscope, not shown.

Theoretical considerations indicate a model for explaining the nature of the Gunn Effect in a semiconductor region. It is proposed in the noted background article by J. B. Gunn, in the IBM Journal of Research and Development, April 1964, at page 155. An electrical description of an electrical shock wave device that would appear approximately to fit the experimental facts is a parallel combination of a frequency independent negative resistance, which represents the tendency of the mean current in the device to decrease in relationship to electrical shock wave propagation therein, and a constant-current alternating current generator whose frequency is determined mainly by the device length, and whose amplitude is a function of applied voltage across the device.

FIGS. 7 to 9 present other embodiments of this invention. The embodiment 102 of FIG. 7 does not utilize the inductive properties of the pulse generator circuit connected to drive terminal 20 but utilizes a resonant circuit having an inductance L3 and a capacitance C2 resonant at a particular modulation frequency. The capacitances C1 and C2 in the embodiment 102 are not tuned so that they provide a resonant circuit with the pulse generator circuit 22. Under the operational condition that the capacitances are related according to C1 very much greater than C2, the high frequency oscillation presented to terminals 40 and 42 of impedance load 38 is comparable to that provided by the embodiment 10 of FIG. 1.

The embodiments of this invention presented in FIGS. 8 and 9 provide modulation of the high frequency oscillation produced by electrical shock wave device 12 from external low frequency oscillator 112. In order to provide the embodiment of FIG. 8, the embodiment 102 of FIG. 7 is modified in that low frequency oscillation source 112 is coupled via transformer 114 into the drive circuit for electrical shock wave device 12. A shunt resistance 116 is connected across the parallel arrangement of inductance L3 and capacitance C2 to stabilize drive terminal 20 for control by low frequency oscillator 112. However, if shunt reistance 116 is omitted and the level $V_D$ of drive pulse 30 is properly less than threshold level $V_T$, the oscillator 112 initiates high frequency oscillation from electrical shock wave device 12, and thereafter it is sustained by self-modulation. To optimize the performance of embodiment 110 of FIG. 8, the parallel circuitry comprising inductance L3, capacitance C2, and resistance 116 is tuned to the drive frequency produced by oscillator 112.

The embodiment 120 of FIG. 9 is a modification of embodiment 10 of FIG. 1 in that self-modulation of embodiment 10 is replaced by an external low frequency oscillation source 112 coupled to the drive line from pulse generator 22 by transformer 114. Additionally, a shunt resistance 122 is connected in parallel across capacitances 34 and 44 to stabilize drive terminal 20 for control by low frequency oscillator 112. If shunt resistance 122 in embodiment 120 of FIG. 9 is not present, drive oscillator source 112 may initiate modulation of the high frequency oscillation output from electrical shock wave device 12 and thereafter self-modulation may be controlling even if oscillator 112 is turned off. For stabilized operation of the embodiment 110 of FIG. 8 and embodiment 120 of FIG. 9, the value of the shunt resistance 116 and value of shunt resistance 122, respectively, is established less than the magnitude of the negative resistance of electrical shock wave device 12 during propagation of electrical shock wave therein.

In summary of the operation of this invention as practiced with self-modulated pulsed oscillators, this invention provides electrical shock wave oscillators whose peak power efficiency is greater than obtained when a stabilized drive applied electric field is utilized. The term "stabilized" connotes absence of oscillation at the drive terminal. The invention is especially applicable where the high frequency power output when plotted versus applied electric field has a rising characteristic over the entire operational range. In particular, for the embodiments 10 of FIG. 1 and 102 of FIG. 7, the drive voltage varies above and below the threshold value required to support electrical shock wave propagation in electrical shock wave device 12 at a frequency determined by the drive circuit components. Illustratively, at a drive frequency of approximately 20 megacycles a drive level of 42 volts corresponds to a stabilized applied field of 5,600 volts per centimeter. With self-modulation, peak fields of approximately 10,000 volts per centimeter, i.e., 80 volts peak voltage level $V_D$ of FIG. 5A, are obtained. The data of FIGS. 6A and 6B result from an operation of embodiment 10 of FIG. 1 with output power at 1,280 megacycles modulated by field variations at 20 megacycles. At the drive terminal, the drive process is cooperative, i.e., the buildup of the high frequency oscillation is accompanied by an increased drive electric field until self-limiting occurs. Additionally, the oscillations at the drive terminal 20 are of a relaxation type, i.e., they build up within one oscillation.

Illustratively, at a stabilized applied electric field of 5,600 volts per centimeter, the peak power output is 5 watts at 2.8 percent efficiency. The drive pulse 30 can be shortened in time until only one high frequency burst 98 is generated. Under this operational condition, peak power output is 23 watts at 13 percent efficiency.

FIG. 10 presents an embodiment 130 for the practice of this invention providing a tuned intermediate frequency radar. The embodiment 130 includes a self-modulated pulsed electrical shock wave oscillator in accordance with the practice of this invention, as described for the embodiments 10 of FIG. 1 and 102 of FIG. 7, which for illustrative purpose utilizes a GaAs electrical shock wave device. The self-modulated pulsed oscillator 132 has a driver 133 therefor which additionally is coupled to display unit 134 to synchronize the display with the remainder of the circuitry embodiment 130. Self-modulated pulsed oscillator 132 is connected to duplexer 136, which in turn is connected via connection 138 to antenna 140 which produces output electromagnetic radiation 141 and receives input electromagnetic radiation 142. Duplexer 136 is connected to nonlinear detector 144, which in turn is connected to intermediate frequency amplifier 146, and the connection therefrom to display 134 completes the circuit presentation for embodiment 130 of this invention providing a tuned intermediate frequency radar. In operation, the microwave output of the self-modulated pulsed oscillator 132 is modulated at an intermediate frequency, e.g., 30 megacycles. Non-linear detector 144 is the receiver which may be a tunnel diode detector. Intermediate frequency amplifier 146 is tuned to the modulation frequency. In contrast with the conventional radar systems, such as superheterodyne, tuned radio-frequency, and crystal video, this system is termed tuned intermediate frequency.

The practice of this invention eliminates the need for a stable local oscillator in the receiver. An exemplary short-range radar in accordance with the practice of this invention will be presented by considering the range equation together with several illustrative operational parameters.

Using the range equation $$R^4 = G^2 \lambda^2 \sigma P/(4v)^3 S,$$

for $G = 30\ db$
$\lambda = 30$ cm (1.0 Gc)
$\sigma = 1.0\ m^2$
$P = 10^3$ watt
$S = 10^{-9}$ watt the resulting range is $$R = 2{,}600 \text{ meters or } 1.6 \text{ miles.}$$

By adding a local oscillator in the receiver portion of the embodiment 130, including non-linear detector 144 and intermediate-frequency amplifier 146, sensitivity and the range may be improved. If 100 percent sinusoidal modulation at the self-modulated pulsed oscillator 132 is assumed, the effective transmitted power decreases by 3 decibels. However, the range is increased to approximately 13.7 miles. It will be understood that the parameters given and the calculated ranges are merely exemplary, as the system 130 FIG. 10 for a tuned intermediate frequency radar may be adapted to different operations.

The practice of this invention has been exemplified herein by describing modulation of the electrical shock wave current oscillation from an electrical shock wave device both by self-modulation and external modulation. It will be understood that more than one self-modulation frequency may be present. Further, combined self-modulation and external modulation at different frequencies may also be utilized.

Several circuit parameters determine the nature of the high frequency current oscillation from an electrical shock wave device. Among the parameters are the effective length of the semiconductor region of the device and the impedance of the load. The presentation of the invention herein has been mainly in terms of microwave frequency implementation. It will be understood that frequencies may be produced by an electrical shock wave device which are characterized as radio-frequency as well as characterized as less than microwave frequency. All that is required for practice of this invention from the frequency point of view is that a relatively high frequency of current oscillation from an electrical shock wave device resultant from electrical shock wave propagation therein be modulated at a relatively low frequency.

What is claimed is:

1. In an oscillator circuit of the type which includes a body of single conductivity type semiconductor material, to which there is applied an electric field above a threshold field at which the body exhibits a negative resistance characteristic due to a change in the mobility of the conduction carriers in the body, to produce output high frequency oscillations in an output means connected to the body, the improvement comprising:

a. input means connected to said body for applying an input voltage across the body which causes the threshold field for the body to be exceeded and said high frequency oscillations to be produced;

b. said input means including means connected to said body forming a driving circuit resonant at a frequency lower than the frequency of said high frequency output oscillations;

c. said negative resistance exhibited by said body when said threshold is exceeded to produce said high frequency oscillations causing the voltage in said driving circuit to resonate at said lower frequency;

d. said output means connected to said body includes output circuit means resonant at the frequency of said high frequency oscillations; and e. said oscillator circuit includes means decoupling said high frequency output resonant circuit from said lower frequency driving resonant circuit.

2. The oscillator circuit of claim 1 wherein said lower frequency oscillations produced in said driving circuit raise the electric field applied to the body to a value greater than twice the threshold field.

3. The oscillator circuit of claim 1 wherein said semiconductor body is a body of gallium arsenide having a resistivity of about two ohm-centimeters, and the electric field applied to said body by said input circuit oscillating at said lower frequency reaches a value of 10,000 volts per centimeter.

4. The oscillator circuit of claim 1 wherein said input voltage applied by said input means to said body is a pulse having a time duration which is approximately one half the reciprocal of said lower input circuit frequency.

5. In an oscillator circuit of the type which includes a body single conductivity type semiconductor material, to which there is applied an electric field above a threshold field at which the body exhibits a negative resistance characteristic due to a change in the mobility of the conduction carriers in the body, to produce output high frequency oscillations in an output means connected to the body, the improvement comprising:

a. input means connected to said body for applying an input voltage signal having a given amplitude to said body;

b. said voltage signal raising the voltage across the body to value above that necessary to cause the electric field in the body to exceed the threshold field for the body and cause said body exhibit a negative resistance characteristic and produce said high frequency oscillations;

c. said input means including means connected to said body forming a driving circuit resonant at a frequency lower than said high frequency, which circuit responds to said negative resistance of the body to raise the voltage applied to the body above the given amplitude of said applied voltage and increase the power output of said high frequency oscillations;

d. said output means connected to said body includes output circuit means resonant at the frequency of said high frequency oscillations; and e. said oscillator circuit includes means decoupling said high frequency output resonant circuit from said lower frequency driving resonant circuit.

6. The oscillator circuit of claim 5 wherein said driving resonant circuit raises the voltage applied to said body to an amplitude sufficient to produce an electric field in the body greater than twice the threshold field.

7. The oscillator circuit of claim 5 wherein said input voltage signal has a time duration no greater than one half the reciprocal of the resonant frequency of said input circuit.

* * * * *